(12) United States Patent
Melikyan (10) Patent No.: US 11,664,318 B2
(45) Date of Patent: May 30, 2023

(54) STACK OF DIES

(71) Applicant: Nokia Solutions and Networks Oy, Espoo (FI)

(72) Inventor: Argishti Melikyan, Marlboro, NJ (US)

(73) Assignee: Nokia Solutions and Networks Oy, Espoo (FI)

( * ) Notice: Subject to any disclaimer, the term of this patent is extended or adjusted under 35 U.S.C. 154(b) by 79 days.

(21) Appl. No.: 17/139,388

(22) Filed: Dec. 31, 2020

(65) Prior Publication Data

US 2022/0208681 A1 Jun. 30, 2022

(51) Int. Cl.
| | |
|---|---|
| *H01L 23/538* | (2006.01) |
| *H01L 25/065* | (2023.01) |
| *H01L 25/16* | (2023.01) |
| *G02B 6/24* | (2006.01) |
| *G02B 6/13* | (2006.01) |
| *G02B 6/122* | (2006.01) |

(52) U.S. Cl.
CPC ............ *H01L 23/5384* (2013.01); *G02B 6/24* (2013.01); *H01L 23/5385* (2013.01); *H01L 23/5386* (2013.01); *H01L 25/0657* (2013.01); *H01L 25/167* (2013.01); *G02B 6/122* (2013.01); *G02B 6/13* (2013.01); *H01L 2221/68313* (2013.01)

(58) Field of Classification Search
CPC ............. H01L 23/5384; H01L 23/5386; H01L 23/5385; H01L 23/538–5389; H01L 25/0657; H01L 25/167; H01L 25/043; H01L 25/074; H01L 25/0756; H01L 25/117; H01L 25/0652; H01L 25/071; H01L 25/112; H01L 2221/68313; H01L 2221/68309; H01L 2221/68304–68395; H01L 21/568; H01L 21/683–68792; H01L 21/673–67396; H01L 2021/6006; H01L 33/0093; H01L 51/003; H01L 27/1266; H01L 27/3209; H01L 2225/06503–06596; G02B 6/13; G02B 6/24; G02B 6/26; G02B 6/43; G02B 6/423; G02B 6/4295
See application file for complete search history.

(56) References Cited

U.S. PATENT DOCUMENTS

| | | |
|---|---|---|
| 6,819,853 B2 | 11/2004 | Lam et al. |
| 9,715,064 B1 | 7/2017 | Gambino et al. |
| 2007/0210428 A1* | 9/2007 | Tan ...................... H01L 25/0657 257/E25.013 |
| 2009/0114927 A1 | 5/2009 | Cho et al. |

(Continued)

OTHER PUBLICATIONS

Zhang, et al.; "High-Density Wafer-Scale 3-D Silicon-Photonic Integrated Circuits"; IEEE Journal of Selected Topics in Quantum Electronics; vol. 24, No. 6; Nov./Dec. 2018; 10 pgs.

(Continued)

*Primary Examiner* — Victor A Mandala
*Assistant Examiner* — Lawrence C Tynes, Jr.

(57) ABSTRACT

An apparatus including a carrier mount having a staircase of steps in an opening in the carrier mount and a plurality of dies, each one of the dies having at least a portion of an edge of a major surface thereof located on one of the steps corresponding to the one of the dies such that the dies form a stack, major surfaces of the dies being substantially parallel in the stack, each of the dies having one or more electro-optical devices thereon.

19 Claims, 7 Drawing Sheets

(56) References Cited

U.S. PATENT DOCUMENTS

| | | | |
|---|---|---|---|
| 2014/0203175 A1* | 7/2014 | Kobrinsky | H04B 10/25 250/214.1 |
| 2017/0207600 A1 | 7/2017 | Klamkin et al. | |
| 2019/0333895 A1* | 10/2019 | Kim | H01L 23/5385 |
| 2020/0098736 A1 | 3/2020 | Liao et al. | |
| 2020/0126917 A1* | 4/2020 | Kaeding | H01L 27/14618 |
| 2020/0284978 A1 | 9/2020 | Kharas et al. | |

OTHER PUBLICATIONS

Selvaraja; "Wafer-Scale Fabrication Technology for Silicon Photonic Integrated Circuits"; Universiteit Gent; Feb. 2011; 244 pgs.

\* cited by examiner

STACK OF DIES

TECHNICAL FIELD

The invention relates, in general, to an apparatus including a stack of dies having one or more electro-optical devices thereon and methods of manufacturing such an apparatus.

BACKGROUND

This section introduces aspects that may help facilitate a better understanding of the inventions. Accordingly, the statements of this section are to be read in this light and are not to be understood as admissions about what is prior art or what is not prior art.

Dies having one or more electro-optical devices thereon, such as active photonic integrated circuits (PICs) are widely used in the telecommunication industry. Maximizing the speed and the broad transmission of multiple signals in parallel while maintaining the fidelity of information transmitted in each of the signals are important goals.

For a one dimensional (1D) array of fiber-to-PIC couplings, optical coupling of a fiber to a die through optical edge couplers can provide for high bandwidth communication and low signal loss, e.g., due polarization dependent loss (PDL), but, such a design is not readily scalable to many fibers. A two dimensional (2D) array of fiber-to-PIC couplings, e.g., using vertical grating couplers is scalable to large numbers of fibers, but, can suffer relatively higher PDL, more bandwidth limitations and more coupling losses, than 1D arrays of fiber-to-PIC couplings.

SUMMARY

Embodiments disclosed herein include providing a three dimensional (3D) stack of dies as an approach to increase optical coupler density in an apparatus, e.g., to increase input-output density for an optical fiber telecommunication apparatus.

One embodiment includes an apparatus including a carrier mount having a staircase of steps in an opening in the carrier mount and a plurality of dies, each one of the dies having at least a portion of an edge of a major surface thereof located on one of the steps corresponding to the one of the dies such that the dies form a stack, major surfaces of the dies being substantially parallel in the stack, each of the dies having one or more electro-optical devices thereon.

Some such embodiments can further include optical edge couplers configured to optically couple ends of optical fibers to the dies such that a near end segment of each one of the fibers is substantially parallel to one of the major surfaces. In some such embodiments, a vertical pitch between the optical edge-couplers of for adjacent ones of the dies is defined by a height of one of the steps of the staircase, the one of the steps being located between the adjacent ones of the dies.

In any such embodiments, each adjacent pair of the dies can be separated by a gap. In any such embodiments the carrier mount can be a silicon substrate.

In any such embodiments, along of edges of first and second ones of the dies, the apparatus can include optical edge-couplers for optical fibers, the optical edge-couplers being arranged in a 2D array. In some such embodiments, two or more of the dies in the stack can be interconnected to each other by through-substrate vias, each of the through-substrate vias passing through one of the dies and coupling to the one of the dies to an adjacent another one of the dies.

Any such embodiments can further include an electrical package, the electrical package coupled to at least one of the dies of the stack.

In some embodiments at least one of side surfaces of first and second ones of the dies includes optical couplers that can be arranged such that a 2D array of the optical couplers is located on the side surfaces. In some such embodiments, a vertical pitch between the optical couplers of a first one of the dies and the optical couplers of one of a second one of the dies is defined by a separation distance between the planar first major surface of the first die and the planar first major surface of the second die. In some such embodiments, two or more of the dies in the stack are interconnected to each other by through-substrate vias, each of the TSVs passing through one of the dies and coupling to the TSV passing through another one of the dies.

Any such embodiments can further include an electrical package, the electrical package coupled to at least one of the dies of the stack.

Another embodiment includes an apparatus including a stack of dies, each of the dies in the stack having a first major surface, an opposite second major surface and side surfaces and having one or more electro-optical devices thereon. At least a first one of the dies and a second one of the dies of the stack are separated by a gap. At least one of the side surfaces of the first and second dies includes optical couplers arranged such that a 2D array of the optical couplers can be formed on at least two of the side surfaces. A vertical pitch between the optical couplers of a first one of the dies and the optical couplers of one of a second one of the dies can be defined by a separation distance between the planar first major surface of the first die and the planar first major surface of the second die.

In some such embodiments of the apparatus, two or more of the dies in the stack can be interconnected to each other by through-substrate vias, each of the through-substrate vias passing through one of the dies and coupling to the through-substrate vias passing through another one of the dies.

Any such embodiments of the apparatus can further include a carrier mount that includes an opening in a surface of the carrier mount, the opening having relatively laterally displaced steps located at different depths from the surface of the carrier mount, wherein at least a portion of each of the dies rest on different ones of the steps. In some such embodiments, the steps located at the different depths in the opening have a vertical separation distance and the vertical pitch from one of the optical couplers of one of the dies resting on one of the steps to another one of the optical couplers of a different one of the dies resting on a different one of the steps is equal to the vertical separation distance between the steps. In some such embodiments, sidewalls of the opening in the carrier mount have different widths that are greater than a width of the respective one of the dies that rests on the one of the steps.

In any such embodiments of the apparatus, the vertical pitch can be at least about 5 percent greater than a thickness of a smaller width one of the two adjacent dies In any such embodiments of the apparatus, the optical couplers at the side surfaces of one of the two or more dies are substantially vertically aligned with a corresponding one of the optical couplers at the side surface of the other one of the two or more die.

Any such embodiments of the apparatus can further include an electrical package, the electrical package coupled to at least one of the dies of the stack. In some such embodiments, a portion of the carrier mount can be located between the electrical package and the stack. In some such embodiments, the electrical package can electrically coupled to the least one of the dies of the stack.

For any such embodiments of the apparatus, the stack of dies can further include an electrical integrated circuit.

Another embodiment includes a method. The method includes forming a stack of dies, including providing a carrier mount, the carrier mount having an opening in a surface of the carrier mount, the opening having steps in the opening, and, positioning the dies of the stack such that a portion of an edge of each die on a corresponding one of the steps, the dies being substantially arranged in parallel in the stack. In the stack, at least the first one of the dies and a second one of the dies of the stack being separated by a gap. In the stack, optical couplers are arranged to enable end coupling of optical fibers along edges of the dies.

BRIEF DESCRIPTION

The embodiments of the disclosure are best understood from the following detailed description, when read with the accompanying FIGUREs. Some features in the figures may be described as, for example, "top," "bottom," "vertical" or "lateral" for convenience in referring to those features. Such descriptions do not limit the orientation of such features with respect to the natural horizon or gravity. Various features may not be drawn to scale and may be arbitrarily increased or reduced in size for clarity of discussion. Reference is now made to the following descriptions taken in conjunction with the accompanying drawings, in which.

In the Figures and text, similar or like reference symbols indicate elements with similar or the same functions and/or structures.

In the Figures, the relative dimensions of some features may be exaggerated to more clearly illustrate one or more of the structures or features therein.

Herein, various embodiments are described more fully by the Figures and the Detailed Description. Nevertheless, the inventions may be embodied in various forms and are not limited to the embodiments described in the Figures and Detailed Description of Illustrative Embodiments.

DETAILED DESCRIPTION OF ILLUSTRATIVE EMBODIMENTS

The description and drawings merely illustrate the principles of the inventions. It will thus be appreciated that those skilled in the art will be able to devise various arrangements that, although not explicitly described or shown herein, embody the principles of the inventions and are included within their scope. Furthermore, all examples recited herein are principally intended expressly to be for pedagogical purposes to aid the reader in understanding the principles of the inventions and concepts contributed by the inventor(s) to furthering the art, and are to be construed as being without limitation to such specifically recited examples and conditions. Moreover, all statements herein reciting principles, aspects, and embodiments of the inventions, as well as specific examples thereof, are intended to encompass equivalents thereof. Additionally, the term, "or," as used herein, refers to a non-exclusive or, unless otherwise indicated. Also, the various embodiments described herein are not necessarily mutually exclusive, as some embodiments can be combined with one or more other embodiments to form new embodiments.

Some embodiments of the invention relate to having a substantially parallel stack of dies wherein an edge of each die is located on a corresponding stair of a staircase located in an opening of a carrier mount.

Some embodiments of the invention benefit from recognition that the advantages of high bandwidth communication and low signal losses, associated with 1D arrays, and the advantages of high scalability, associated with 2D arrays, can by simultaneously be realized in a stack of dies (e.g., dies stacked on top of each other, in a third vertical dimension perpendicular to major surfaces of the dies, to form a three dimensional, 3D, stack of the dies) as disclosed herein. Optical interface coupling, e.g., via optical couplers at each die in the 3D stack, can provide low coupling losses and low PDL, analogous to that obtained using 1D arrays, because the coupling is substantially polarization-independent coupling. Sides of the dies with the optical coupler forming the 3D stack together form or provide a 2D array of optical couplers, to facilitate for high bandwidth communication, analogous to that obtained using 2D arrays. The 2D array optical couplers in the 3D stack is unlike conventional 2D arrays that rely on the use of vertical grating couplers for optical coupling, which in turn, is associated with higher optical coupling loss and PDL.

It was surprising that a stack of dies could provide a 2D array of optical coupler with low optical coupling losses and low PDL because the die-to-die thickness of dies can be variable, e.g., the die thickness variability can be ±5, 10, 15 µm or greater in some instances. Because of such die thickness variability, if the dies are directly stacked on top of each other to form a 3D stack, then the vertical pitch between optical couplers in the different dies in the stack will also be variable. Consequently, the vertical pitch between optical couplers may not be a uniform predictable number and therefore optical coupling losses and/or PDL can be at unacceptable levels, e.g., because the optical field of the optical coupler are not readily all aligned, or readily alignable, with an optical interface (e.g. the cores of optical fibers may be off-centered with the optical couplers). Although such inefficiencies could be at least partly mitigated by using activate alignment procedures, e.g., by optically aligning ends of the optical fibers or their cores to the 2D array optical couplers, such procedures would increase the time and cost of manufacture.

As disclosed herein, in some embodiments, a stack of dies can be formed by placing the dies on different steps of a carrier mount such that there is a gap between the dies (e.g., gaps between adjacent or nearest neighbor dies). The gaps account for the thickness variability between dies. Moreover, because the depths of the different steps of the carrier mount can be precisely controlled to have a known value, the vertical pitch between optical couplers in the different dies resting or mounted on those steps can be precisely controlled and known.

Figure 1:
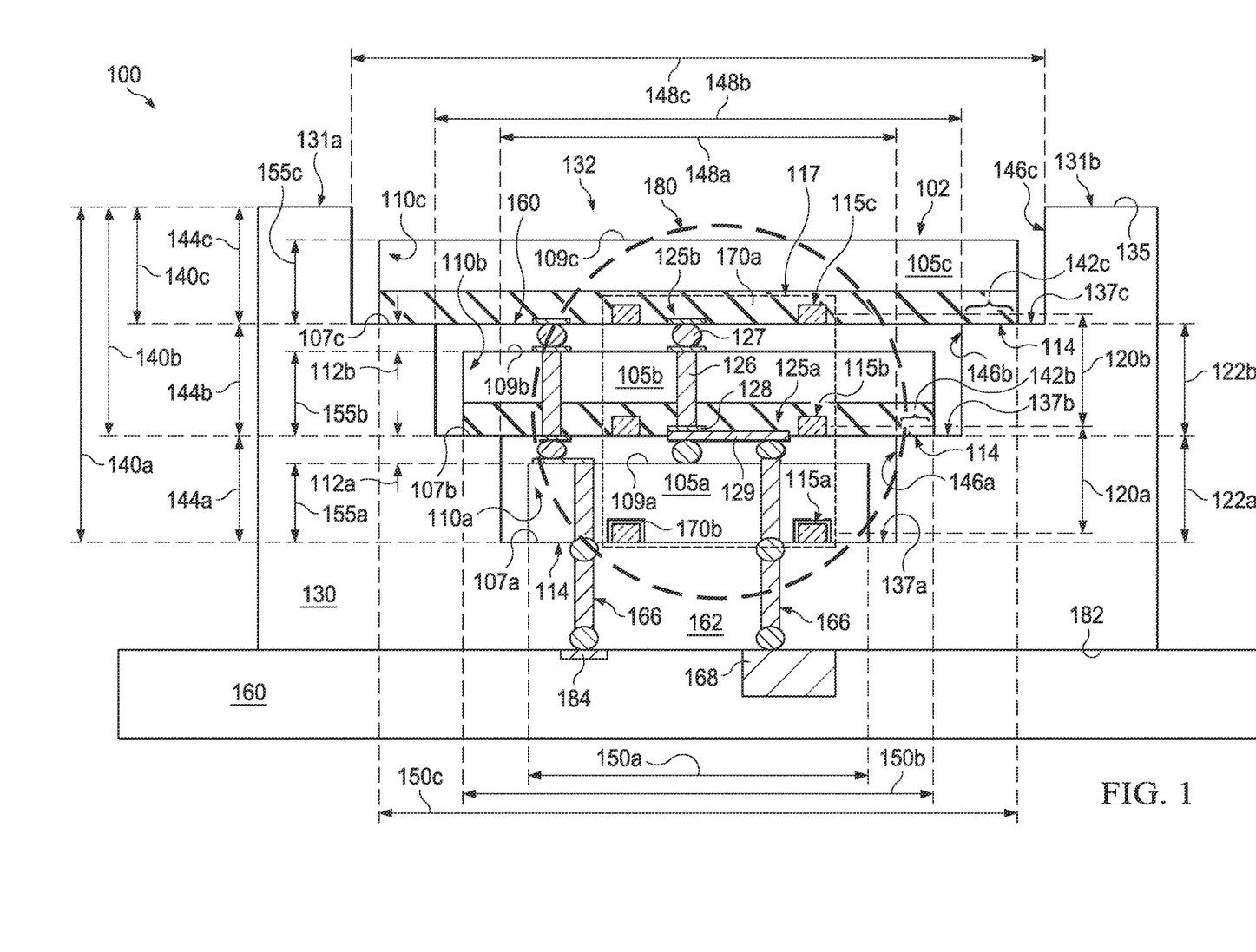
FIG. 1 presents a cross-sectional view of an example apparatus of the disclosure.

One embodiment of the disclosure is an apparatus. FIG. 1 presents a cross-sectional views of an example embodiment of apparatus 100 of the disclosure. With continuing reference to FIG. 1 throughout, some embodiments of the apparatus 100 include a carrier mount 130 having one or more staircases of steps (e.g., staircases 131a, 131b of steps 137) in an opening 132 in the carrier mount 130. The apparatus also includes a plurality of dies 105, each one of the dies 105 having at least a portion of an edge of a major surface thereof (e.g., ends of surface 107) located on one of a set of the steps 137 (e.g., step portion 142), corresponding to the one of the dies 105 such that the dies 105 form a stack 102, major surfaces 107, 109 of the dies 105 being substantially parallel in the stack, each of the dies having one or more electro-optical devices 114 thereon (e.g., on major surface 107).

For the purposes of the present disclosure, the bottom-most step (e.g., step 137a) is considered to be part of the one or more staircases 131a, 131b.

In some embodiments, the steps 137 in the mount 130 can have equal heights (e.g., distances 144a, 144b, 144c substantially equal to each other).

Some such embodiments can further include optical couplers 115 configured to optically couple ends of optical fibers (generally represented in the figures as optical interface 180) to the dies such that a near end segment of each one of the fibers is substantially parallel to one of the major surfaces of the dies. In some such embodiments, each adjacent pair of the dies is separated by a gap 112. In some such embodiments, the carrier mount 130 can be a silicon substrate. The term optical coupler as used herein refers to optical edge couplers (e.g., planar, angled, or lensed optical couplers) and/or grating optical couplers.

In some such embodiments, at least one of side surfaces of first and second ones of the dies (e.g., surfaces 110a, 110b of dies 105a, 105b) includes optical couplers (e.g., optical couplers 115a, 115b, 115c, in some embodiments configured as optical edge couplers) arranged such that a 2D array of the optical couplers (e.g., array 117) is located along one or more of the side surfaces 110a, 110b, 110c of the dies forming the stack (e.g., the optical couplers 115a, 115b, or 115c of at least two of the planar side surfaces 110a, 110b or 110c).

In some such embodiments, a vertical pitch 120a 120b between the optical couplers 115a of a first one of the dies 105a and the optical couplers 115b of one of a second one of the dies 105b is defined by a separation distance (e.g., vertical separation distances 122a 122b) between the planar first major surface 107a of the first die 105a and the planar first major surface 107b of the second die 105b. In some embodiments the second die 105b can be adjacent to the first die 105a. However, in other embodiments, such as when an electrical integrated circuit (e.g., circuit 305, FIG. 3) is present within the stack, the first and second dies may not be adjacent to each other, but, nearest neighboring ones of such dies may still have the vertical pitch 120a 120b.

In some such embodiments, two or more of the dies in the stack 102 can be interconnected to each other by through-substrate vias (TSVs, 125a, 125b). Some or each of the TSVs (e.g., TSV 125a) passing through one of the dies can electrically couple to some or each of the TSVs passing through another one of the dies (e.g., TSV 125b passing through die 105b and coupling to TSV 125a of die 105a) e.g., vertically adjacent or nearest neighbor dies. The term through-substrate vias includes any of metal via structures 126 passing through the dies as well as solder bumps 127, metal contact pads 128, or metal routing structures 129 connected to the via structure 126 to facilitate the interconnection between TSVs or to connect to other electrical devices, as familiar to those with skill in the pertinent art.

Any such embodiments can further include an electrical package 160, the electrical package coupled to at least one of the dies 105a of the stack 102. Embodiment of the electrical package can be or include any of analog or digital electrical integrated circuit dies, electro-optic dies, a passive interposer dies or any combination thereof.

FIGS. 1-5 present cross-sectional views of various other example embodiments of the apparatus 100 of the disclosure.

With continuing reference to FIG. 1 throughout, embodiments of the apparatus 100 include a stack of dies (e.g., stack 102), each of the dies (e.g., 105a, 105b, 105c) in the stack having a first major surface (e.g., planar surfaces 107a, 107b, 107c), an opposite second major surface (e.g., planar surfaces 109a, 109b, 109c) and the side surfaces (e.g., planar side or edge surfaces 110a, 110b, 110c). The dies can have one or more electro-optical devices 114 thereon (e.g., on major surface 107). At least a first one of the dies 105a and a second one of the dies 105b of the stack (e.g., in some embodiments, adjacent or nearest neighbor dies) can be separated by a gap (e.g., gap 112a between dies 105a and 105b or gap 112b between dies 105b and 105c). At least one of the side surfaces of the first and second dies (e.g., along edge or side surfaces 110a, 110b of dies 105a, 105b) includes optical couplers (e.g., optical couplers 115a, 115b, 115c) are arranged such that a 2D array of the optical couplers (e.g., array 117) is formed or located on at least two of the side surfaces (e.g., the optical couplers 115a, 115b, or 115c of at least two of the side surfaces 110a, 110b or 110c), e.g., to facilitate optical coupling to an optical interface (e.g., interface 180).

A vertical pitch 120a 120b between the optical couplers 115a of a first one of the dies 105a and the optical couplers 115b of one of a second one of the dies 105b is defined by a separation distance between the planar first major surface 107a of the first die 105a and the planar first major surface 107b of the second die 105b (e.g., vertical separation distances 122a 122b). E.g., in various embodiments the separation distances 122a 122b can substantially equal to a distance between the steps (e.g., steps 137a, and 137b or steps 137b and 137c of the staircases 131a, 131b), or, equal to the thickness of the die plus the gap between dies (e.g., thickness 155a of die 105a plus gap 112a or thickness 155b of die 105b plus gap 112b, or a distance between steps 137b, 137c or the width of the die 155b plus gap 112b). E.g., the pitch between the optical couplers can be set to known precise values by the separation distances between the planar first major surfaces of dies due to the optical edge couplers being located on or near set locations relative the major surface of the dies, which in turn, are on their corresponding steps of the mount 130.

The term, die having one or more electro-optical devices thereon, can include a supporting material layer (e.g., a silicon, silica, lithium niobate, indium phosphide or similar material layer) that is configured to facilitate transmitting light structures to or from the optical couplers 115, e.g. via the one or more electro-optical devices 114, passive optical structures (e.g., planar optical waveguides) or combinations thereof thereon the die. For instance, in some embodiments the dies are configured as active photonic integrated circuit dies or other optical dies familiar to those skilled in the pertinent art.

In some such embodiments, two or more of the dies in the stack 102 can be interconnected to each other by TSVs (TSVs, 125a, 125b). E.g., one or more of the TSVs passing through one of the dies (e.g., TSVs 125a passing through die 105a) can couple to the TSVs passing through another one of the dies (e.g., TSVs 125b passing through die 105b) can be coupled (e.g., TSV 125a coupled to TSV 125b). For instance, the two or more dies can be electrically connected to each other, and/or to external electrical circuitry via some of the TSVs, and/or the two or more of the dies can be mechanically connected to each other (e.g., via a melt reflow process to bond ends of TSVs together or via rigid mechanical structures, such as metallic rods, held in some of the TSVs) to structurally hold the two dies or more dies together. The TSVs can be a through-silicon, through-silica, through-lithium niobate, through-indium phosphide or through-other material via when the dies are formed from a silicon, silica, lithium niobate, indium phosphide, or other material substrates, as familiar to those skilled in the pertinent art.

Figure 5:
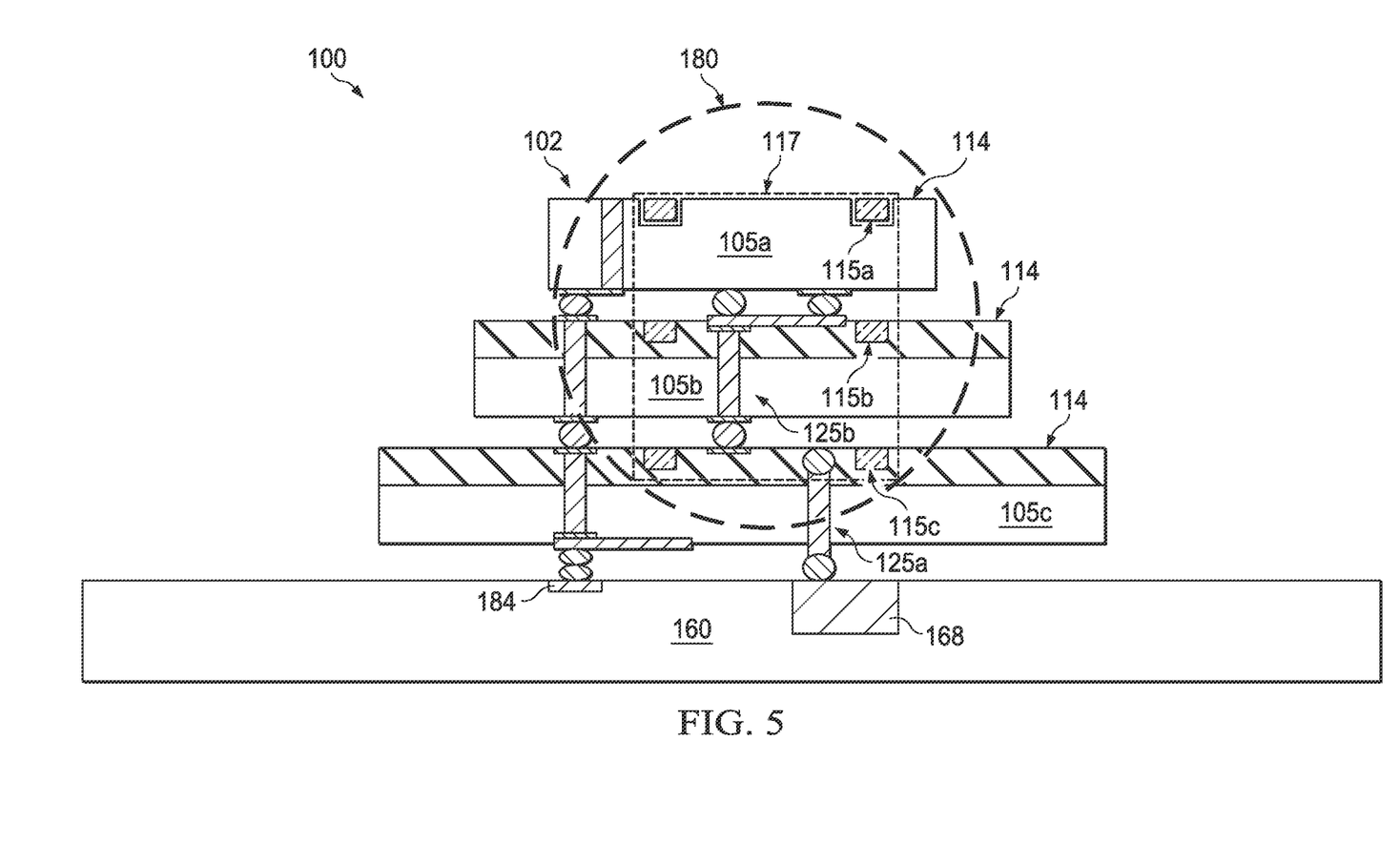
FIG. 5 presents a cross-sectional view of another example apparatus of the disclosure.

In some embodiments, such as illustrated in FIG. 5, when the dies of the stack are held together, e.g., by TSVs after a melt reflow process or by rigid mechanical structures, the carrier mount can be removed from the final apparatus without altering the precisely known vertical pitch between the optical couplers of the dies of the stack.

However, in other embodiments, such as illustrated in FIGS. 1-4, the carrier mount 130 can be retained, e.g., in some embodiments, to help structurally hold the dies together and maintain the known vertical pitch between the optical couplers.

In embodiments of the apparatus 100 where the carrier mount 130 is included, the carrier mount can include an opening (e.g., opening 132) in a surface of the carrier mount (e.g., surface 135), the opening having relatively laterally displaced steps (e.g., progressively wider separation between steps 137a, 137b, 137c on either side of the opening to form staircases 131a, 131b) that are located at different depths (e.g., depths 140a, 140b, 140c) from the surface of the carrier mount, where at least a portion of each of the dies (e.g., portions 142b, 142c of dies 105b, 105c) rest on different ones of the steps (e.g., steps 137a 137b, 137c).

In some such embodiments, the steps 137a, 137b, 137c located at the different depths 140a, 140b, 140c in the opening 132 can have a vertical separation distance (e.g., distances 144a, 144b) and the vertical pitch (e.g., pitches 120a 120b) from one of the optical couplers of one of the dies resting on one of the steps to another one of the optical couplers (e.g., optical edge couplers in some embodiments) of a different one of the dies resting on a different one of the steps is equal to the separation distance between the steps.

For instance, in some embodiments, a length of the vertical pitch 120a between substantially vertically aligned optical couplers 115a and 115b is equal to the separation distance 144a between step 137a and step 137b and a length of the vertical pitch 120b between optical couplers 115b and 115c is equal to the separation distance 144b between step 137b and step 137c. For instance, in some embodiments, the vertical pitch between pairs of adjacent, or nearest neighbor dies, and in some embodiments, all adjacent or nearest neighbor pairs of dies throughout the stack, are at a same constant vertical pitch length, e.g., to facilitate reliable or predictable interfacing of the 2D array to a fiber array or other optical input/output interface structure without special customization of the interface.

In some such embodiments of the apparatus 100, sidewalls of the opening 132 of the carrier mount 130 (e.g., sidewalls 146a 146b 146c define the steps 137a, 137b, 137c) define portions of the opening 132 to have different widths 148a, 148b, 148c that are greater than a width 150a, 150b, 150c of the respective one of the dies that rests on the one of the steps. E.g., in various embodiments, to accommodate die-to-die width variations, the step widths 148 can be at least about 1, 2, or 5 percent greater than the respective die width 150.

In some such embodiments of the apparatus 100, the smallest width die (e.g., die 105a with width 150a) rests on the one step 137a that is at the deepest depth 140a from the carrier mount surface 135, the second smallest width die 105b rests on the one step 137b that is at the second deepest depth 140b from the carrier mount surface 135, etc.

In some embodiments of the apparatus 100, to accommodate die-to-die thickness variations, the vertical pitch 120a, 120b can be at least about 5 percent greater, and in some embodiments at least about 10, 20 percent greater, than a thickness 155a, 155b, 155c of a smaller width one of the two adjacent dies. For instance, if the thickness of a smaller width one of the two adjacent or nearest neighbor dies (e.g., die 105a of the two adjacent pairs of dies 105a, 105b, or die 105b or the two adjacent pairs of dies 105b, 105c) is 100 µm, then the vertical pitch 120 can be 105, 107, or 120 µm in various embodiments, depending upon the die-to-die thickness variability. For instance, if the standard deviation in the die-to-die thickness variability is ±1, 2, or 3% (e.g., ±1, 2, or 3 µm when the dies thickness equals 100 µm), then in some embodiments, the vertical pitch 120 can be set to be at least three standard deviation units greater, e.g., 103, 106 or 109 µm so that at least about 99% of the dies of the stack will have a known pitch as defined by the separation distances 144a, 144b between the steps 137a, 137b, 137c.

In some embodiments of the apparatus 100, the optical couplers at the side surfaces of one of the two or more dies (e.g., optical coupler 115a located along the edge or side surface 110a of die 105a) can be about vertically aligned with a corresponding one of the optical couplers at the side surface of the other one of the two or more die (e.g., an offset between optical couplers 115a located along the edge or side surface 110a vertically aligned with corresponding one of optical couplers 115b and/or 115c located along the edge or side surface 110b, 110c of dies 105b and/or 105c can be equal to or less than 1, 2, 3, 4, 5, 10, 20 or 30 µm in some embodiments). For instance, vertically aligned ones of the optical couplers among the side surfaces of the dies can form an approximately square or rectangular 2D array of the optical couplers. However in other embodiment, the optical couplers in the stack of the dies can be arranged among the side surfaces of the dies to form other regular (e.g., triangular, pentagonal, hexagonal, etc.) 2D array patterns of optical couplers.

As depicted in FIGS. 1-5, any embodiments of the apparatuses 100 can further include an electrical package 160, the electrical package coupled to at least one of the dies 105a of the stack 102. Embodiments of the electrical package can be or include any of analog or digital electrical integrated circuit dies, electro-optic dies, a passive interposer dies or any combination thereof. In some such embodiments, as illustrated in FIG. 1, a portion of the carrier mount (e.g., portion 162) can be located between the electrical package 160 and the stack 102. In some such embodiments the electrical package 160 can be electrically coupled to the least one of the dies 105a of the stack 102. For instance, at least one of the TSVs 125a of the at least one die (e.g., dies 105a) can be electrically connected to the electrical package 160. For instance, the at least one of the TSV 125a of the at least one die 105*a* can connect to a through carrier via (e.g., TCV 166) passing through the portion of the carrier mount 162 to connect to electrical features of the electrical package 160.

Figure 2:
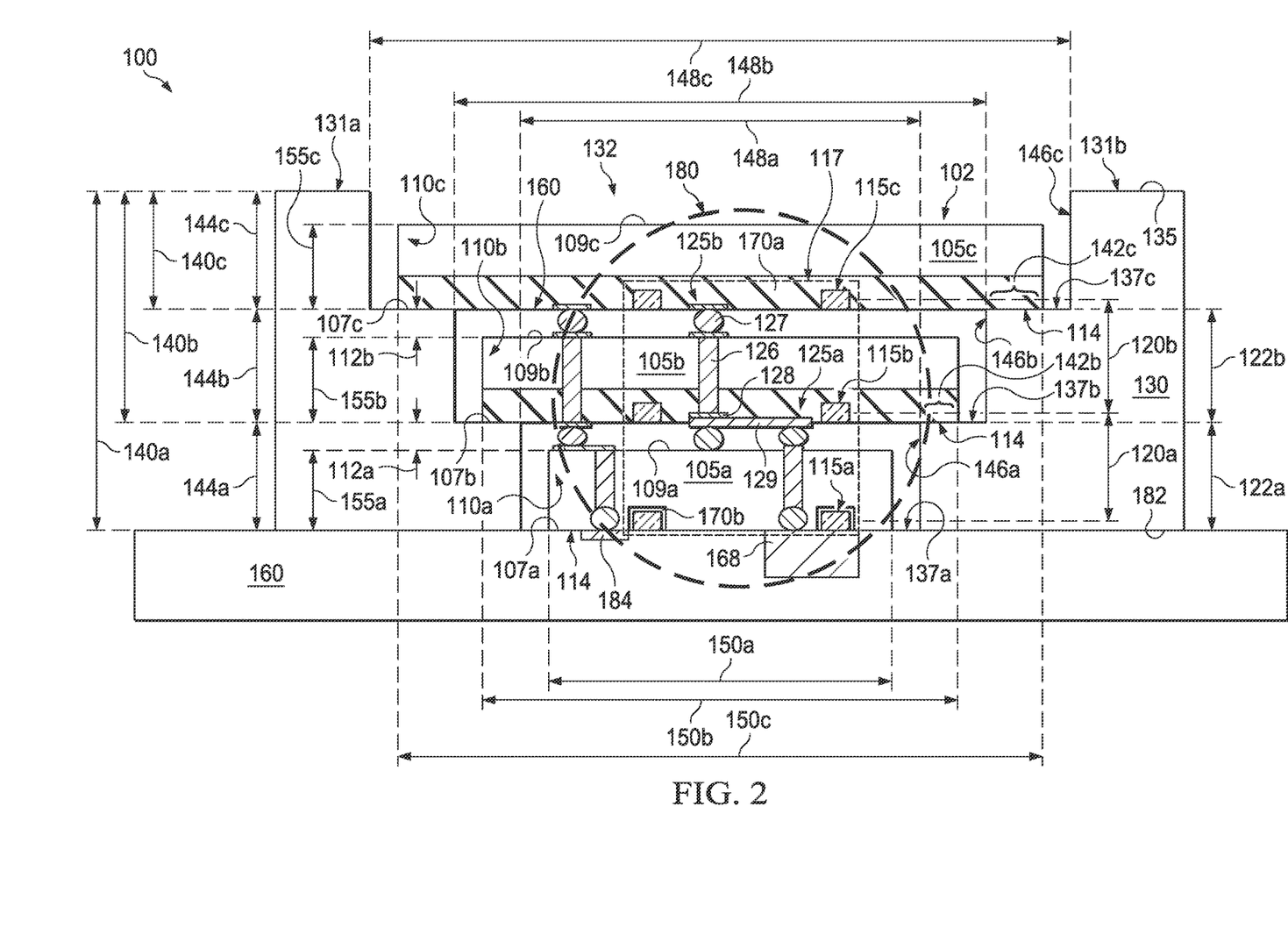
FIG. 2 presents a cross-sectional view of another example apparatus of the disclosure.

In other embodiments, as illustrated in FIG. 2, the at least one of the TSV 125*a* of the at least one die 105*a* can be connected directly to electrical features of the electrical package 160, e.g. when there is no portion of the carrier mount between the stack and the electrical package.

Any embodiments of the electrical package 160 can include a heat sink 168 and the heat sink 168 can be thermally coupled to the least one of the die 105*a* of the stack 102. For instance, at least one of the TSVs 125*a* of the at least one die 105*a* can be connected to the heat sink 168 of the electrical package 160. For instance, the at least one of the TSVs 125*a* can be connected to a TCV 166 passing through the portion of the carrier mount 162 to connect to the heat sink 168 of the electrical package 160 (FIG. 1). For instance, the at least one of the TSVs 125*a* can connect directly to electrical features of the electrical package 160 when there is no portion of the carrier mount between the stack and the electrical package (FIG. 2).

Figure 3:
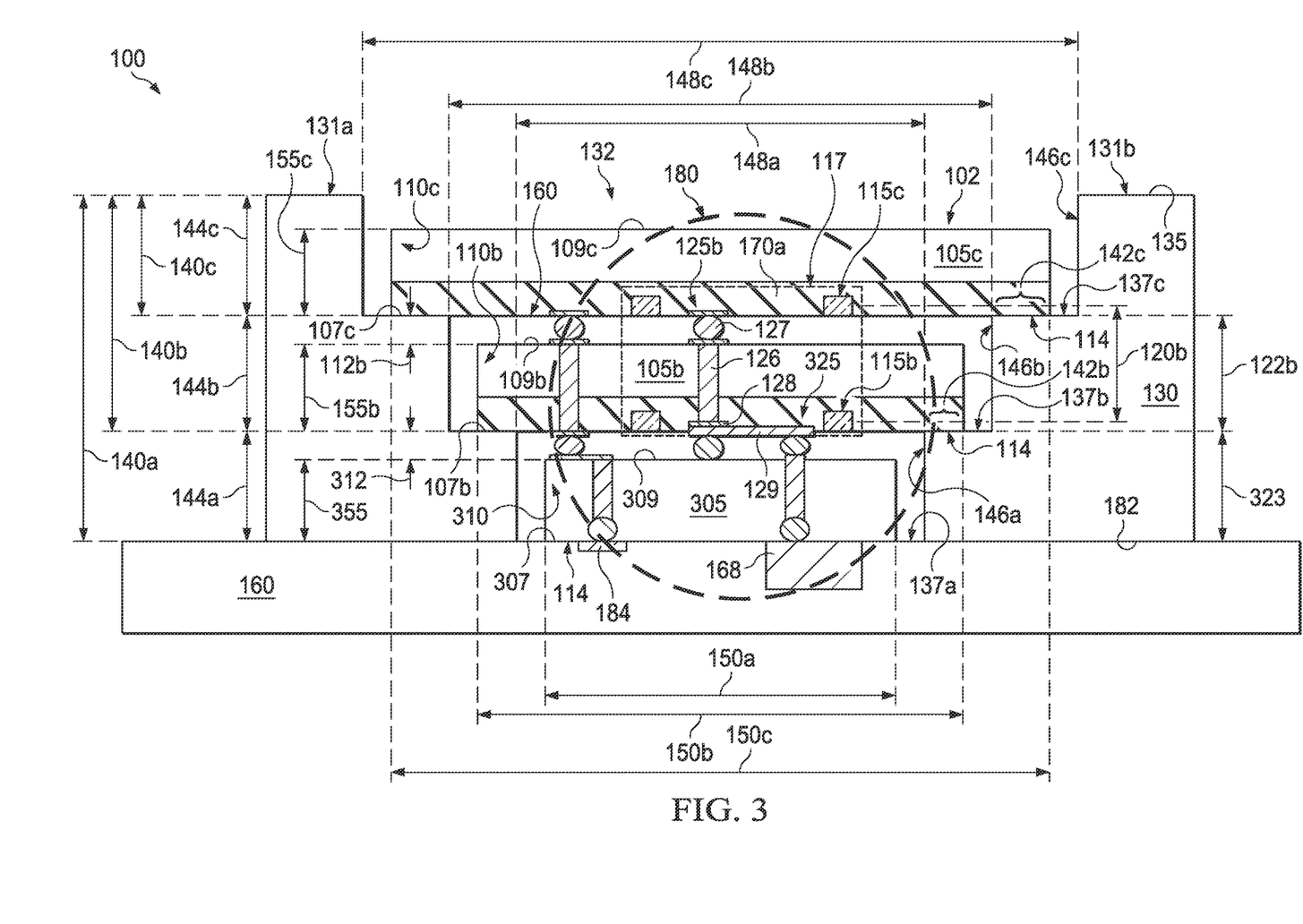
FIG. 3 presents a cross-sectional view of another example apparatus of the disclosure.

For any embodiments of the apparatus 100, the stack 102 itself can further include an electrical integrated circuit 305 (FIG. 3). For instance, the electrical integrated circuit 305 can be at any location in the stack e.g., between any two of the dies 105 or at either to top or bottom end of the stack 102. The electrical integrated circuit 305 can be or include any of analog or digital electrical integrated circuit dies, electro-optic dies, a passive interposer dies or any combination thereof.

As illustrated in FIG. 3, embodiments of the electrical integrated circuit 305 of the stack 102 can have a first major surface (e.g., planar surfaces 307), an opposite second major surface (e.g., planar surfaces 309) and side surfaces (e.g., planar side or edge surface 310). The electrical integrated circuit 305 of the stack 102 can be separated by a gap 312 between the electrical integrated circuit 305 and adjacent ones of the dies 105. The electrical integrated circuit 305 can rest on one of the steps 137 of the carrier mount 130, when retained as part of the apparatus 100. The electrical integrated circuit 305 can have a separation distance 323 between the planar first major surface 307 of the electrical circuit 305 and the planar first major surface 107*b* of adjacent ones of the die (e.g., die 105*b*) that is defined by the vertical separation distance (e.g., distances 144*a*, 144*b*) of the steps of the carrier mount 130 (e.g., steps 137*a* and 137*b*). E.g., the separation distance 323 can be at least 5 percent greater than a thickness 355 of the electrical integrated circuit 305. The electrical integrated circuit 305 can have through-substrate vias (TSVs, 325) that interconnect the circuit 305 to one or more of the dies 105 and/or to the electrical package 160 when present in the apparatus 100.

Figure 4:
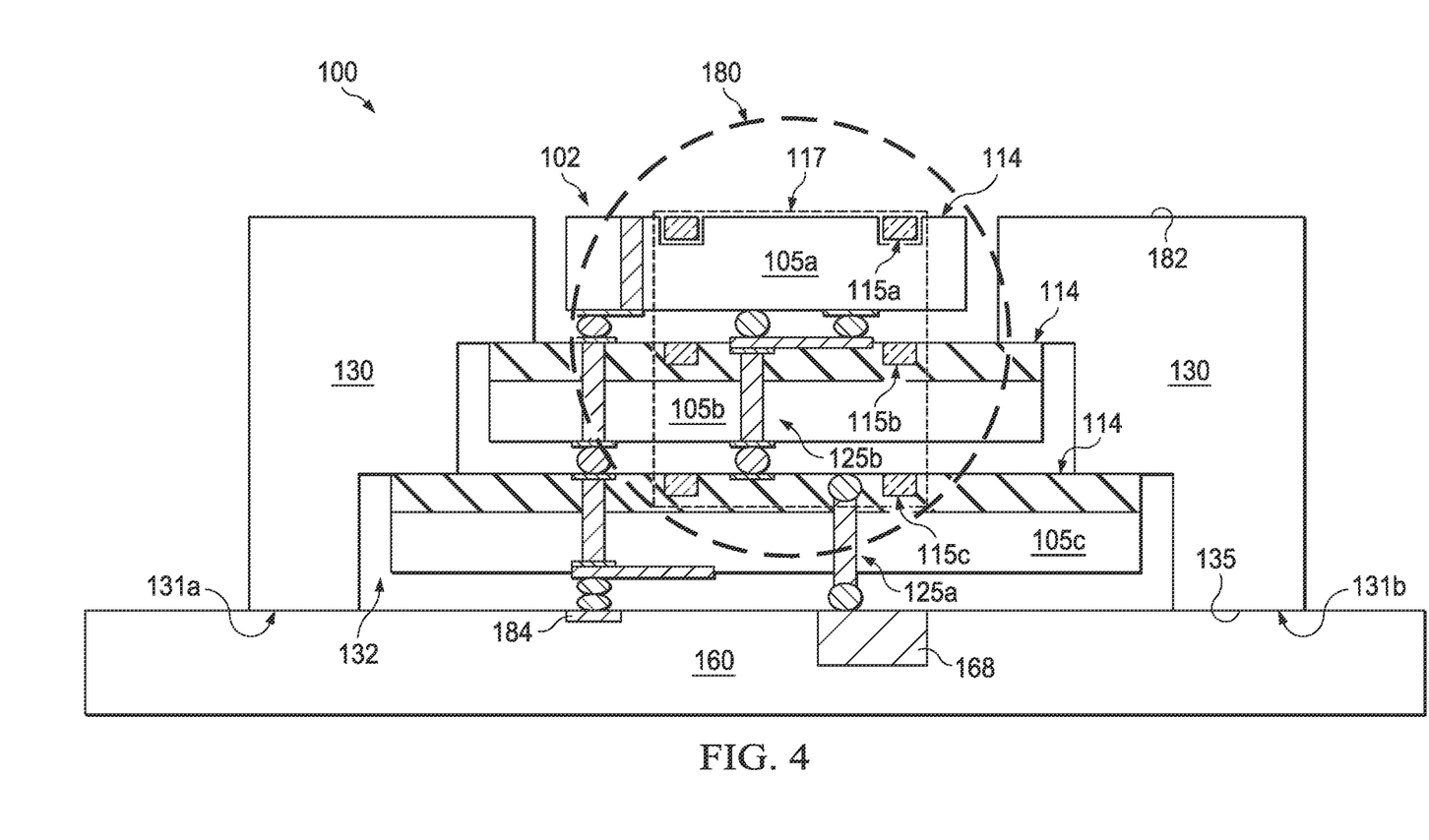
FIG. 4 presents a cross-sectional view of another example apparatus of the disclosure.

As illustrated in FIG. 4, for some embodiments of the apparatus 100, the stack 102 and optional carrier mount 130 can be inverted before being coupled to the electrical package 160, such that the widest one of the dies (e.g., die 105*c*) is adjacent to the electrical package 160.

For some embodiments of the apparatus 100, the first major surface 107 of the dies 105 further includes an optical cladding 170 surrounding the optical couplers 115 of the dies. For instance, embodiments of the optical cladding can be a silicon dioxide layer 170*a* or an air gap 170*b* surrounding the optical couplers 115.

Any embodiments of the apparatus 100, can further include an optical interface 180 coupled to the 2D array 117 of the optical couplers 115 (e.g., optical edge couplers in some embodiments). For instance, in some embodiments, the optical interface 180 can be or include one or more optical fibers or end segments thereof, e.g., multiple single core optical fibers, where an optical core of each optical fiber can be optically coupled (e.g., end-coupled) to a different one of the optical couplers, or, a multi-core fiber, where each optical core of the multi-core fiber can be optically coupled to a different one of the optical couplers. For instance, in some embodiments, the optical interface 180 can be or include one or more optical gratings such as free-space optical focusing gratings or other free-space optical interfaces familiar to those skilled in the pertinent art.

Figure 6:
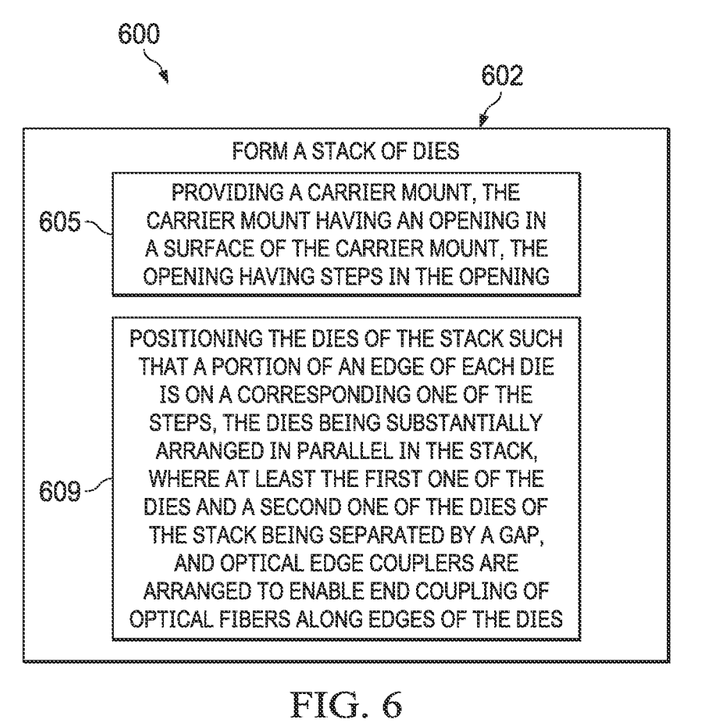
FIG. 6 presents a flow diagram of a method of selected steps in the manufacture of an apparatus, including apparatus embodiments disclosed herein.

Another embodiment of the disclosure is a method of manufacturing an apparatus, including apparatuses embodiments described herein. FIG. 6 presents a flow diagram of selected steps of an embodiment of a method 600 of manufacturing the apparatus, including any of the apparatus 100 embodiments disclosed in the context of FIGS. 1-5.

With continuing reference to FIGS. 1-6 throughout, some embodiments of the method 600 include forming a stack 102 of dies 105 (e.g., step 602). Forming the stack 102 (step 602) can include providing a carrier mount 130 (e.g., step 605), the carrier mount having an opening (e.g., opening 132) in a surface of the carrier mount (surface 135), the opening 132 having steps 137 in the opening 132. Forming the stack 102 (step 602) can further include positioning the dies 105 of the stack 102 (e.g., step 609) such that a portion of an edge of each die (e.g., portion 142) is on a corresponding one of the steps 137, the dies being substantially arranged in parallel in the stack 102. In the stack at least the first one of the dies and a second one of the dies of the stack are separated by a gap, and optical edge couplers are arranged to enable end coupling of optical fibers along edges of the dies.

Figure 7:
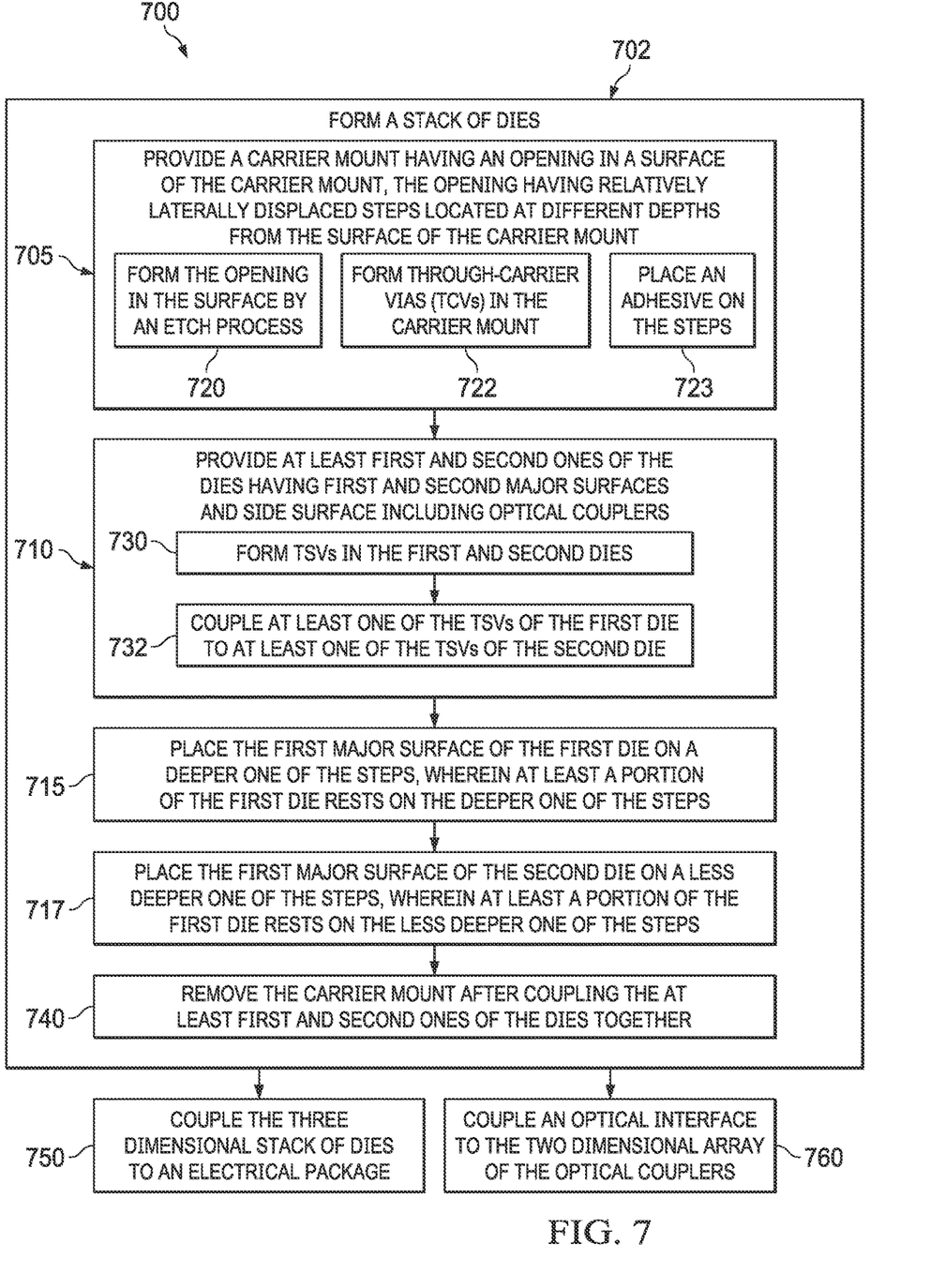
FIG. 7 presents a flow diagram of selected steps of another embodiment of a method of manufacturing the apparatus, including any of the apparatus embodiments disclosed herein.

FIG. 7 presents a flow diagram of selected steps of another embodiment of a method 700 of manufacturing the apparatus, including any of the apparatus 100 embodiments disclosed in the context of FIGS. 1-5.

Some embodiments of the method 700 include forming a stack 102 of dies 105 (e.g., step 702). Forming the stack 102 (e.g., step 702) can include providing a carrier mount 130 (step 705), the carrier mount having an opening (e.g., opening 132) in a surface of the carrier mount (e.g., surface 135), the opening 132 having relatively laterally displaced steps (e.g., steps 137*a*, 137*b*, 137*c*) located at different depths (e.g., depths 140*a*, 140*b*, 140*c*) from the surface 135 of the carrier mount 130.

Forming the stack 102 (e.g., step 702) can further include providing at least first and second ones of the dies (e.g., step 710), each of the dies (e.g., 105*a*, 105*b*, 105*c*) having a first major surface (e.g., planar surfaces 107*a*, 107*b*, 107*c*), an opposite second major surface (e.g., planar surfaces 109*a*, 109*b*, 109*c*) and side surfaces (e.g., planar side surfaces 110*a*, 110*b*, 110*c*), at least one of the side surfaces of the first and second dies (e.g., surfaces 110*a*, 110*b* of dies 105*a*, 105*b*) including optical couplers (e.g., optical couplers 115*a*, 115*b*, 115*c*).

Forming the stack 102 (e.g., step 702) can further include placing (e.g., step 715) the first major surface of the first die on a deeper one of the steps (step 137*a* at depth 140*a* or step 137*b* at depth 140*b*)), wherein at least a portion of the first die rests on the deeper one of the steps (e.g., step 137*a*).

Forming the stack 102 (e.g., step 702) can further include placing (e.g., step 717) the first major surface of the second die on a less deeper one of the steps (step 137*b* at depth 140*b* or step 137*c* at depth 140*c*)) 137*b*, wherein at least a portion of the second die rests on the less deeper one of the steps (e.g., step 137*b*).

Following the forming of the stack 102 (e.g., step 702) at least the first one of the dies 105a and a second one of the dies 105b of the stack can be separated by a gap (e.g., gap 112a between dies 105a and 105b or gap 112b between dies 105b and 105c). Further, the optical couplers (e.g., optical couplers 115a, 115b, 115c) can be arranged such that a 2D array of the optical couplers (e.g., array 117) is located on at least two of the side surfaces (e.g., the optical couplers 115a, 115b, or 115c of at least two of the edge or side surfaces 110a, 110b or 110c). Additionally, a vertical pitch 120a 120b between the optical couplers 115a of a first one of the dies 105a and the optical couplers 115b of one of a second one of the dies 105b can be defined by a separation distance (e.g., separation distances 122a 122b) between the planar first major surface 107a of the first die 105a and the planar first major surface 107b of the second die 105b.

In some such embodiments, providing the carrier mount (step 710) can include forming the opening (e.g., step 720, opening 132) in the surface 135 of a solid material substrate (e.g., a silicon layer or similar solid material layer) by an etch process to form the relatively laterally displaced steps (e.g., steps 137) located at the different depths (e.g., depths 140) in the opening 132 of the carrier mount. In other embodiments, providing the carrier mount (step 710) can include providing the carrier mount with the opening and the steps prefabricated, e.g., via a molding process. E.g., the carrier mount could be formed by placing organic material (e.g., polymer or pre-polymer photo curable resin materials) into a mold cast that is shaped to provide the desired opening and steps therein and/or then cured to form a solid organic material carrier mount. E.g., a solid organic or inorganic material layer block could be machined to provide the desired opening and steps therein.

In some such embodiments, providing the carrier mount (step 710) can include forming through-carrier vias (TCVs 166) in the carrier mount (e.g., step 722) where a first end of the through-carrier vias are on a surface of the deepest one of the steps (e.g., step 137a) and a second end of the TCVs are on an outer surface of the carrier mount (e.g., surface 182) that is opposite the first surface of the carrier mount (e.g., surface 135).

In some such embodiments, providing the carrier mount (step 710) can include placing an adhesive on the steps (e.g., step 723) e.g., and epoxy glue adhesive or other adhesive familiar to one skilled in the pertinent art. Then as part placing the first major surfaces of the first and second dies on the steps (e.g., steps 715, 717) the dies can be placed such that the first and second dies are adhered to their respective steps In some embodiments, providing the at least first and second ones of the dies (e.g., step 710) includes forming TSVs 125a, 125b in the first and second dies 105a, 105b (e.g., step 730), and in some embodiments coupling at least one of the TSVs 125a of the first die to at least one of the TSVs 125b of the second die (e.g., step 732).

In some such embodiments providing the first and second ones of the dies (e.g., step 710) can further include coupling some of the TSVs 125a of the first die 105a to some of the TCV 166 of the carrier mount 130, e.g., to help secure the stack 102 to the carrier mount 130. In some such embodiments, the coupling of the TSVs 125a, 125b to each other and/or the TCV 166 can include a same heat reflow process to melt the solder bumps 127 and thereby adhere the solder bumps to the contact pads 128. In other embodiments, two separate heat reflow processes are applied to couple the TSVs 125a of the first die 105a to some of the TCV 166, and then couple the TSVs 125a of the first die 105a to the TSVs 125b of the second die 105b.

In some embodiments, forming the stack of dies (step 702) can further include removing the carrier mount 130 after coupling the at least first and second ones of the dies 105a, 105b together (e.g., step 740). For instance, after the dies 105a, 105b are coupled together, e.g., by a heat reflow process to couple the TSVs 125a, 125b of different dies 105a, 105b to each other (e.g., step 732), the carrier mount 130 and the stack of dies 102 can be mechanically separated from each other, or, the carrier mount 130 (e.g., made of an organic material such as a photo curable resin) can be removed by heat and/or chemical processes familiar to those skilled in the pertinent art.

Some embodiments of the method 700 can further include coupling the stack of dies (e.g., die stack 102) to an electrical package (e.g., electrical package 160; step 750). For instance, as part of step 750 the stack of dies can be coupled to the electrical package by coupling the TSVs of one of the dies (e.g., TSV 125 of die 105), or a TCV 166 or the carrier mount 130 to a contact pad of the electrical package (e.g., pad 184 of electrical package 160) by a heat reflow process.

Some embodiments of the method 700 can further include coupling an optical interface 180 to the 2D array of the optical couplers (e.g., 2D array 117 of optical couplers 115; step 760). For instance, as part of step 760, the ends of one or more optical fibers of the optical interface 180 can be placed in one or more V-shaped grooves of a fiber carrier interface and then fiber carrier interface or a stack of the fiber carrier interface can be edge-coupled to the 2D array 117 of optical couplers.

Those skilled in the art to which this application relates will appreciate that other and further additions, deletions, substitutions and modifications may be made to the described embodiments.

What is claimed is:

1. An apparatus, comprising:
   a carrier mount having a staircase of steps in an opening in the carrier mount;
   a plurality of dies, each one of the dies having at least a portion of an edge of a major surface thereof located on one of the steps corresponding to the one of the dies such that the dies form a stack, major surfaces of the dies being substantially parallel in the stack, each of the dies having one or more electro-optical devices thereon; and
   optical edge couplers on side surfaces of the dies to optically couple ends of optical fibers to the dies such that a near end segment of each one of the fibers is substantially parallel to one of the major surfaces.

2. The apparatus of claim 1, wherein each adjacent pair of the dies is separated by a gap.

3. The apparatus of claim 1, wherein the carrier mount is a silicon substrate.

4. The apparatus of claim 1, wherein along the side surfaces of the dies, the optical edge-couplers are arranged in a 2D array.

5. The apparatus of claim 4, wherein two or more of the dies in the stack are interconnected to each other by through-substrate vias, each of the through-substrate vias passing through one of the dies and coupling to the one of the dies to an adjacent another one of the dies.

6. The apparatus of claim 1, further including an electrical package, the electrical package coupled to at least one of the dies of the stack.

7. An apparatus, comprising
a carrier mount having a staircase of steps in an opening in the carrier mount;
a plurality of dies, each one of the dies having at least a portion of an edge of a major surface thereof located on one of the steps corresponding to the one of the dies such that the dies form a stack, major surfaces of the dies being substantially parallel in the stack, each of the dies having one or more electro-optical devices thereon; and
optical edge couplers to optically couple ends of optical fibers to the dies such that a near end segment of each one of the fibers is substantially parallel to one of the major surfaces, wherein a vertical pitch between the optical edge-couplers for adjacent ones of the dies is defined by a height of one of the steps of the staircase, the one of the steps being located between the adjacent ones of the dies.

8. An apparatus, comprising:
a stack of dies, each of the dies in the stack having a first major surface, an opposite second major surface and side surfaces and having one or more electro-optical devices thereon, wherein:
at least a first one of the dies and a second one of the dies of the stack are separated by a gap,
at least one of the side surfaces of the first and second dies includes optical couplers on side surfaces of the dies arranged such that a 2D array of the optical couplers of the first and second dies is formed on at least two of the side surfaces, and
a vertical pitch between the optical couplers of a first one of the dies and the optical couplers of one of a second one of the dies is defined by a separation distance between the planar first major surface of the first die and the planar first major surface of the second die.

9. The apparatus of claim 8, wherein two or more of the dies in the stack are interconnected to each other by through-substrate vias, each of the through-substrate vias passing through one of the dies and coupling to the through-substrate vias passing through another one of the dies.

10. The apparatus of claim 8, further including a carrier mount that includes an opening in a surface of the carrier mount, the opening having relatively laterally displaced steps located at different depths from the surface of the carrier mount, wherein at least a portion of each of the dies rest on a corresponding one of the steps.

11. The apparatus of claim 10, wherein the steps located at the different depths in the opening have a vertical separation distance and the vertical pitch from one of the optical couplers of one of the dies resting on one of the steps to another one of the optical couplers of a different one of the dies resting on a different one of the steps is about equal to the vertical separation distance between the steps.

12. The apparatus of claim 10, wherein sidewalls of the opening in the carrier mount have different widths that are greater than a width of the respective one of the dies that rests on the one of the steps.

13. The apparatus of claim 8, wherein the vertical pitch is at least about 5 percent greater than a thickness of a smaller width one of the two adjacent dies.

14. The apparatus of claim 8, wherein the optical couplers at the side surfaces of one of the two or more dies are substantially vertically aligned with a corresponding one of the optical couplers at the side surface of the other one of the two or more die.

15. The apparatus of claim 8, further including an electrical package, the electrical package coupled to at least one of the dies of the stack.

16. The apparatus of claim 15, wherein a portion of the carrier mount is located between the electrical package and the stack.

17. The apparatus of claim 15, wherein the electrical package is electrically coupled to the least one of the dies of the stack.

18. The apparatus of claim 8, wherein the stack of dies further includes an electrical integrated circuit.

19. A method, comprising:
forming a stack of dies, including:
providing a carrier mount, the carrier mount having an opening in a surface of the carrier mount, the opening having steps in the opening; and
positioning the dies of the stack such that a portion of an edge of each die is on a corresponding one of the steps, the dies being substantially arranged in parallel in the stack, wherein:
in the stack, at least the first one of the dies and a second one of the dies of the stack being separated by a gap,
in the stack, optical edge couplers on side surfaces of the dies are arranged to enable end coupling of optical fibers along edges of the dies, and
a vertical pitch between the optical edge-couplers for adjacent ones of the dies is defined by a height of one of the steps of the staircase, the one of the steps being located between the adjacent ones of the dies.

* * * * *